US012796121B2

(12) United States Patent
Zhang

(10) Patent No.: US 12,796,121 B2
(45) Date of Patent: Nov. 10, 2026

(54) PHOTOELECTRIC SENSOR AND FABRICATION METHOD THEREOF, AND ELECTRONIC DEVICE

(71) Applicants: Semiconductor Manufacturing International (Beijing) Corporation, Beijing (CN); Semiconductor Manufacturing International (Shanghai) Corporation, Shanghai (CN)

(72) Inventor: Siriguleng Zhang, Beijing (CN)

(73) Assignees: Semiconductor Manufacturing International (Beijing) Corporation, Beijing (CN); Semiconductor Manufacturing International (Shanghai) Corporation, Shanghai (CN)

( * ) Notice: Subject to any disclaimer, the term of this patent is extended or adjusted under 35 U.S.C. 154(b) by 358 days.

(21) Appl. No.: 18/684,125

(22) PCT Filed: Aug. 20, 2021

(86) PCT No.: PCT/CN2021/113770

§ 371 (c)(1),
(2) Date: Feb. 15, 2024

(87) PCT Pub. No.: WO2023/019547

PCT Pub. Date: Feb. 23, 2023

(65) Prior Publication Data

US 2024/0222415 A1 Jul. 4, 2024

(51) Int. Cl.
*H10F 39/18* (2025.01)
*H10F 39/00* (2025.01)
(Continued)

(52) U.S. Cl.
CPC ....... *H10F 39/1843* (2025.01); *H10F 39/018* (2025.01); *H10F 39/805* (2025.01);
(Continued)

(58) Field of Classification Search
CPC ...... H10F 39/018; H10F 39/12; H10F 39/184; H10F 39/1843; H10F 39/805;
(Continued)

(56) References Cited

U.S. PATENT DOCUMENTS

2013/0020468 A1* 1/2013 Mitsuhashi ........... H10F 39/811 257/E21.585
2017/0229494 A1* 8/2017 Hsu ..................... H10F 39/8057
(Continued)

FOREIGN PATENT DOCUMENTS

CN 110085614 A * 8/2019 ........... H10F 39/024
CN 116344560 A * 6/2023 ............ H10F 39/011
(Continued)

*Primary Examiner* — Matthew E Warren
(74) *Attorney, Agent, or Firm* — Anova Law Group, PLLC

(57) ABSTRACT

A photoelectric sensor includes: isolation structures in a pixel substrate between photosensitive units and including conductive layers; interconnection structures distributed in the pixel substrate with ends exposed on a second surface, including first interconnection structures in a first lead area and second interconnection structures in a second lead area and electrically connected to the first interconnection structures; a metal grid located on and in contact with the conductive layers on the second surface; a connection layer on the second surface in the first lead area and in contact with the metal grid and the first interconnection structures; and pad layers on the second surface in the lead area. The pad layers include a first pad layer in the second lead area and in contact with ends of the second interconnection structures facing the second surface.

20 Claims, 5 Drawing Sheets

(51) Int. Cl.
*H10W 80/00* (2026.01)
*H10W 90/00* (2026.01)

(52) U.S. Cl.
CPC ......... *H10F 39/807* (2025.01); *H10F 39/811* (2025.01); *H10W 80/312* (2026.01); *H10W 80/327* (2026.01); *H10W 90/792* (2026.01)

(58) Field of Classification Search
CPC ...... H10F 39/807; H10F 39/811; H10F 77/14; H10W 72/90; H10W 80/312; H10W 80/327; H10W 90/792; H10W 99/00
See application file for complete search history.

(56) References Cited

U.S. PATENT DOCUMENTS

| | | | | |
|---|---|---|---|---|
| 2018/0277586 | A1* | 9/2018 | Yao | H10F 39/18 |
| 2022/0020804 | A1* | 1/2022 | Kim | H10F 39/811 |
| 2022/0149101 | A1* | 5/2022 | Lee | H10F 39/8057 |
| 2022/0336505 | A1* | 10/2022 | Kao | H10F 39/024 |
| 2024/0194716 | A1* | 6/2024 | Huang | H10F 39/014 |

FOREIGN PATENT DOCUMENTS

| | | | | | |
|---|---|---|---|---|---|
| FR | 3026891 | A1 | * | 4/2016 | H10D 86/201 |
| KR | 20200072057 | A | * | 6/2020 | H10F 39/803 |

* cited by examiner

PHOTOELECTRIC SENSOR AND FABRICATION METHOD THEREOF, AND ELECTRONIC DEVICE

CROSS-REFERENCE TO RELATED APPLICATION

This application is a national phase entry under 35 U.S.C §371 of International Application No. PCT/CN2021/113770, filed Aug. 20, 2021, the content of which is incorporated herein by reference in its entirety.

TECHNICAL FIELD

The present disclosure generally relates to the field of semiconductor fabrication technology and, more particularly, relates to a photoelectric sensor and its fabrication method, and an electronic device.

BACKGROUND

A photoelectric sensor is a device that converts optical signals into electrical signals. Its working principle is based on the photoelectric effect. The photoelectric effect means that when light shines on certain substances, electrons of the substances absorb the energy of the photons, and a corresponding electrical effect occurs.

For example, charge coupled device (CCD) image sensors and CMOS image sensors use photoelectric conversion functions to convert optical images into electrical signals and then output digital images, and are currently widely used in digital cameras and other optoelectronic devices. A time of flight (TOF) distance sensor such as a direct time of flight (DTOF) sensor, records times when a light pulse is emitted and detected, and then converts the time difference to distance information. This technology is used in various ranging scenarios such as autonomous driving, sweeping robots, virtual reality (VR)/augmented reality (AR) modeling, etc.

In a photoelectric sensor, a dark count of pixels seriously affects the frame rate and performance of the sensor. To reduce the dark count, one method is to apply a voltage to a backside metal grid (BMG) on a back side of a pixel wafer. The backside metal grid is electrically connected to a deep trench isolation (DTI) structure, such that holes accumulate at an interface between the deep trench isolation structure and a pixel substrate.

However, the photosensitive performance of existing photoelectric sensors needs to be improved.

Technical Problems

The preset disclosure provides a photoelectric sensor and its fabrication method, and an electronic device, to improve performance of the photoelectric sensor.

SUMMARY

To solve the above technical problems, the present disclosure provides a photoelectric sensor having a photosensitive area and a lead area surrounding the photosensitive area. The lead area includes a first lead area and a second lead area surrounding the first lead area. The photoelectric sensor includes: a pixel substrate, including a first surface and a second surface opposite to each other, where a plurality of photosensitive units is formed in the pixel substrate in the photosensitive area; isolation structures in the pixel substrate between the plurality of photosensitive units and exposing the second surface of the pixel substrate, where the isolation structures include conductive layers; a plurality of interconnection structures distributed in the pixel substrate, where an end of each interconnection structure is exposed on the second surface, the plurality of interconnection structures includes first interconnection structures in the first lead area and second interconnection structures in the second lead area, and the second interconnection structures are electrically connected to the first interconnection structures; a metal grid located on the conductive layers on the second surface and in contact with the conductive layers; a connection layer on the second surface in the first lead area and in contact with the metal grid and the first interconnection structures, to electrically connect the metal grid and the first interconnection structures; and pad layers on the second surface in the lead area, where a thickness of the pad layers is larger than thicknesses of the connection layer and the metal grid, and the pad layers include a first pad layer in the second lead area and in contact with ends of the second interconnection structures facing the second surface.

Another aspect of the present disclosure also provides a fabrication method of a fabrication method of a photoelectric sensor. The method includes: providing a pixel substrate including a first surface and a second surface opposite to each other, where the pixel substrate has a photosensitive area and a lead area surrounding the photosensitive area, the lead area includes a first lead area and a second lead area surrounding the first lead area, and a plurality of photosensitive units is formed in the pixel substrate in the photosensitive area; forming isolation structures in the pixel substrate between the plurality of photosensitive units, where an end of each isolation structure is exposed on the second surface, and each isolation structure includes a conductive layer; forming a plurality of interconnection structures distributed in the pixel substrate, where an end of each interconnection structure is exposed on the second surface, the plurality of interconnection structures includes first interconnection structures in the first lead area and second interconnection structures in the second lead area, and the second interconnection structures are electrically connected to the first interconnection structures; forming pad layers on the second surface in the lead area, where the pad layers include a first pad layer in the second lead area and in contact with ends of the second interconnection structures facing the second surface; and in a same process for forming the pad layers, forming a metal grid located on conductive layers on the second surface, and a connection layer on the second surface and in contact with the metal grid and the first interconnection structures, where the metal grid is in contact with the conductive layers and the connection layer electrically connects the metal grid and the first interconnection structures.

Another aspect of the present disclosure also provides an electronic device including a photoelectric sensor provided by various embodiments of the present disclosure.

Effective Benefits

Compared to existing technologies, the present disclosure has following benefits. In the photoelectric sensor provided by the present disclosure, the interconnection structures may include first interconnection structures located in a first lead area and second interconnection structures located in a second lead area. The second interconnection structures may be electrically connected to the first interconnection structures. A connection layer may electrically connect a metal grid and the first interconnection structures. A first pad layer in contact with the second interconnection structures may be also provided in the second lead area, such that the metal grid may be electrically connected to the first pad layer through the connection layer, the first interconnection structures and the second interconnection structures connected in sequence. Accordingly, a voltage may be able to be applied to a conductive layer in an isolation structure through the metal grid, to reduce the dark count of the photoelectric sensor. A thickness of the pad layer may be larger than a thickness of the connection layer and the metal grid. The pad layer may include the first pad layer located in the second lead area. The first pad layer may be formed with other pad layers located in the lead area in the same process, such that the first pad layer may have a relatively large thickness and may have a thickness highly consistent with other pad layers located in the lead area, thereby avoiding the inconsistent height of the first pad layer and other pad layer located in the lead area and too thin first pad layer. The process risks caused by the non-uniform height of the pad layer and the over-thin first pad layer may be reduced, thereby reducing the difficulty of packaging and testing. The performance of the photoelectric sensor may be improved.

The present disclosure also provides a fabrication method of a photoelectric sensor. When forming interconnection structures, the interconnection structures may include first interconnection structures located in a first lead area and second interconnection structures located in a second lead area. The second interconnection structures may be electrically connected to the first interconnection structures. A connection layer may electrically connect a metal grid and the first interconnection structures. A first pad layer in contact with the second interconnection structures may be also provided in the second lead area, such that the metal grid may be electrically connected to the first pad layer through the connection layer, the first interconnection structures and the second interconnection structures connected in sequence. Accordingly, a voltage may be able to be applied to a conductive layer in an isolation structure through the metal grid, to reduce the dark count of the photoelectric sensor. A thickness of the pad layer may be larger than a thickness of the connection layer and the metal grid. The pad layer may include the first pad layer located in the second lead area. The first pad layer may be formed with other pad layers located in the lead are in the same process, such that the first pad layer may have a relatively large thickness and may have a highly consistent thickness with other pad layers located in the lead area, thereby avoiding the inconsistent height of the first pad layer and other pad layer located in the lead area and too thin first pad layer. The process risks caused by the non-uniform height of the pad layer and the over-thin first pad layer may be reduced, thereby reducing the difficulty of packaging and testing. The performance of the photoelectric sensor may be improved

DETAILED DESCRIPTION

As described in the background, the performance of current photoelectric sensor still needs to be improved. The reasons of the poor photosensitive performance of current photoelectric sensors will be analyzed and described below in combination with a photoelectric sensor FIG. 1 illustrates a cross-sectional view of a photoelectric sensor.

Figure 1:
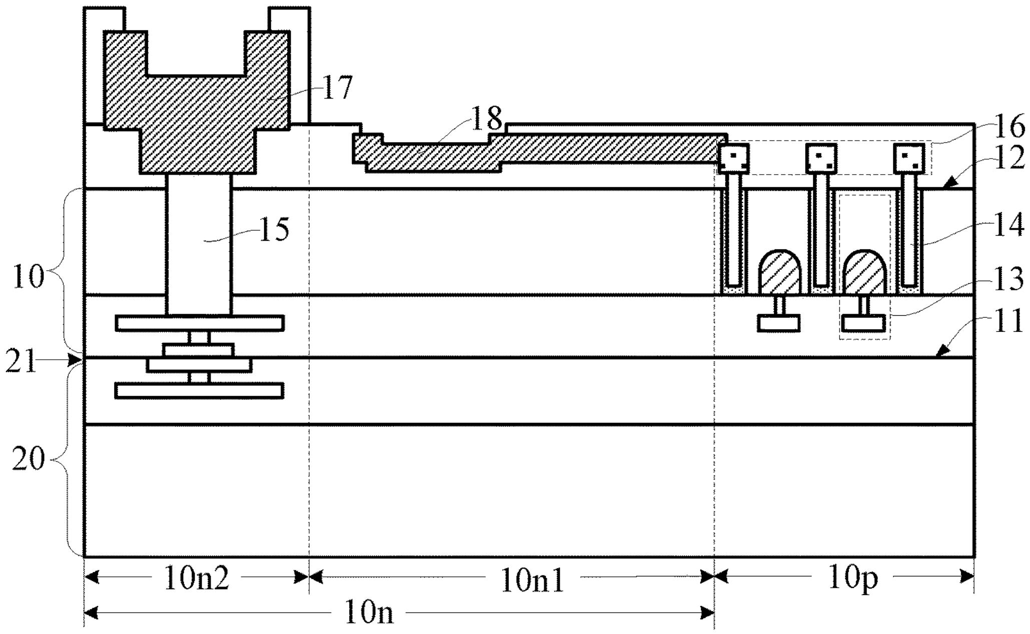
FIG. 1 illustrates a cross-section view of a photoelectric sensor.

As shown in FIG. 1, the photoelectric sensor includes a photosensitive area 10*p* and a lead area 10*n* surrounding the photosensitive area 10*p*. The lead area 10*n* includes a first lead area 10*n*1 and a second lead area 10*n*2 from the inside to the outside. The photoelectric sensor includes: a logic substrate 20, including a bonding surface 21 and a logic device formed in the logic substrate 20; a pixel substrate 10, including a first surface 11 and a second surface 12 opposite to each other, where the first surface 11 is bonded to the bonding surface 21 of the logic substrate 20 and a plurality of photosensitive units 13 is formed in the pixel substrate 10 in the photosensitive area 10*p*; isolation structures (not labeled) located in the pixel substrate 10 in the photosensitive area 10*p*, each of which include an end exposed on the second surface 12 and a conductive layer 14; a through-hole interconnection structure 15 that penetrates the pixel substrate 10 in the second lead area 10*n*2 and is electrically connected to the logic device; a metal grid 16 located on conductive layers 14 above the second surface 12 and is in contact with the conductive layers 14; a first pad layer 17 located on an end of the through-hole interconnection structure 15 toward the second surface 12; and a second pad layer 18 located on the first lead area 10*n*1 of the second surface 12 and electrically connected to the metal grid 16. Top surfaces of the second pad layer 18 and the metal grid 16 are lower than the top surface of the first pad layer 17.

By connecting the second pad layer 18 to the metal grid 16, a voltage is able to be applied to the isolation structure on the back side (i.e., the second surface 12) of the pixel substrate 10 through the second pad layer 18 and the metal grid 16, such that holes accumulate at the interface between the isolation structures and the pixel substrate 10 to reduce the dark count of the photoelectric sensor.

However, the second pad layer 18 is usually formed in the same process as the metal grid 16. Because of the smaller line width of the metal grid 16 and facilitating the patterning of the metal grid 16, the metal grid 16 is usually thin. Accordingly, the second pad layer 18 is also thin, such that the top surfaces of the second pad layer 18 and the metal grid 16 are lower than the top surface of the first pad layer 17, causing the height consistency of the second pad layer 18 and the first pad layer 17 to be poor. Also, since the second pad layer 18 is thin, the difficulty and process risk of subsequent packaging and testing is easily increased, thereby leading to poor performance of the photoelectric sensor.

The present disclosure provides a photoelectric sensor to at least partially alleviate the above problems. The interconnection structures may include first interconnection structures located in a first lead area and second interconnection structures located in a second lead area. The second interconnection structures may be electrically connected to the first interconnection structures. A connection layer may electrically connect a metal grid and the first interconnection structures. A first pad layer in contact with the second interconnection structures may be also provided in the second lead area, such that the metal grid may be electrically connected to the first pad layer through the connection layer, the first interconnection structures and the second interconnection structures connected in sequence. Accordingly, a voltage may be able to be applied to a conductive layer in an isolation structure through the metal grid, to reduce the dark count of the photoelectric sensor. A thickness of the pad layer may be larger than a thickness of the connection layer and the metal grid. The pad layer may include the first pad layer located in the second lead area. The first pad layer may be formed with other pad layers located in the lead area in the same process, such that the first pad layer may have a relatively large thickness and may have a thickness highly consistent with other pad layers located in the lead area, thereby avoiding the inconsistent height of the first pad layer and other pad layer located in the lead area and too thin first pad layer. The process risks caused by the non-uniform height of the pad layer and the over-thin first pad layer may be reduced, thereby reducing the difficulty of packaging and testing. The performance of the photoelectric sensor may be improved.

The present disclosure also provides a fabrication method of a photoelectric sensor. When forming interconnection structures, the interconnection structures may include first interconnection structures located in a first lead area and second interconnection structures located in a second lead area. The second interconnection structures may be electrically connected to the first interconnection structures. A connection layer may electrically connect a metal grid and the first interconnection structures. A first pad layer in contact with the second interconnection structures may be also provided in the second lead area, such that the metal grid may be electrically connected to the first pad layer through the connection layer, the first interconnection structures and the second interconnection structures connected in sequence. Accordingly, a voltage may be able to be applied to a conductive layer in an isolation structure through the metal grid, to reduce the dark count of the photoelectric sensor. A thickness of the pad layer may be larger than a thickness of the connection layer and the metal grid. The pad layer may include the first pad layer located in the second lead area. The first pad layer may be formed with other pad layers located in the lead are in the same process, such that the first pad layer may have a relatively large thickness and may have a highly consistent thickness with other pad layers located in the lead area, thereby avoiding the inconsistent height of the first pad layer and other pad layer located in the lead area and too thin first pad layer. The process risks caused by the non-uniform height of the pad layer and the over-thin first pad layer may be reduced, thereby reducing the difficulty of packaging and testing. The performance of the photoelectric sensor may be improved.

The embodiments of the present disclosure will be described in the following with reference to drawings, to illustrate the implementation and benefits of the present disclosure.

Figure 2:
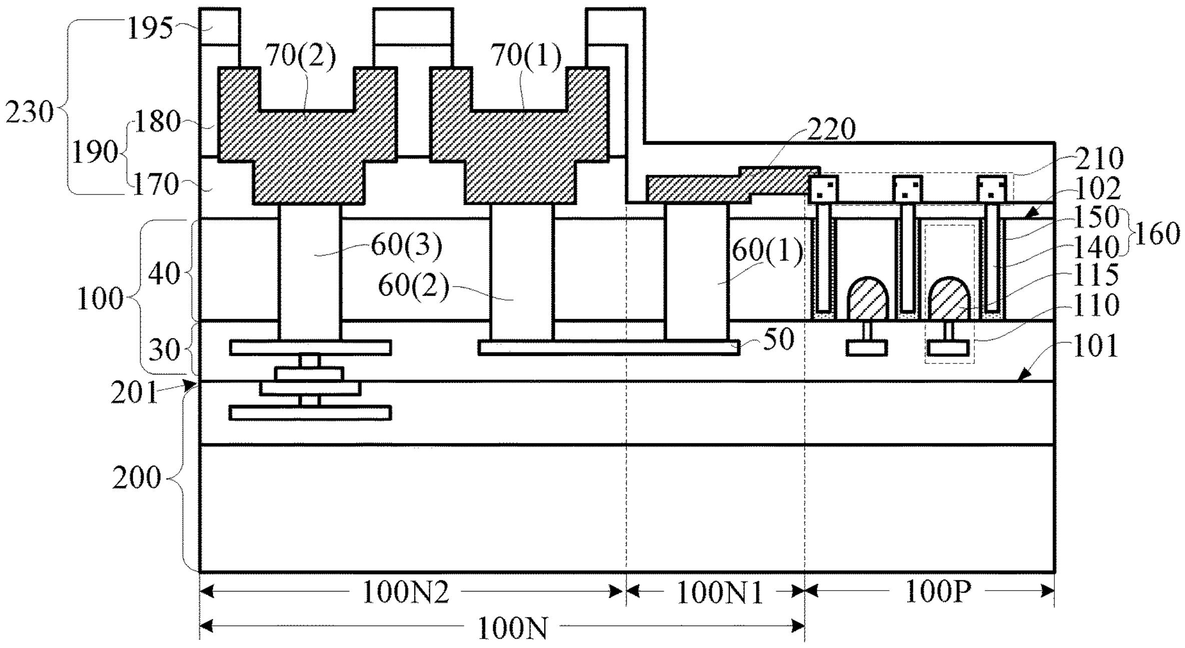
FIG. 2 illustrates a cross-section view of a photoelectric sensor according to various disclosed embodiments of the present disclosure.

FIG. 2 illustrates a cross-sectional view of a photoelectric sensor provided by one embodiment of the present disclosure.

As an example, in this embodiment, the photoelectric sensor is a time of flight (TOF) sensor. More specifically, the photoelectric sensor may be a direct time of flight (DTOF) sensor. In some other embodiments, the photoelectric sensor may also be an indirect time of flight (iTOF) sensor.

In some other embodiments, the photoelectric sensor may also be a charge coupled device (CDD) image sensor, a CMOS image sensor, or other types of photoelectric sensors.

As shown in FIG. 2, in one embodiment, the photoelectric sensor may include a photosensitive area 100P and a lead area 100N surrounding the photosensitive area 100P. The lead area 100N may include a first lead area 100N1 and a second lead area 100N2 surrounding the first lead area 100N1. A plurality of photosensitive units 110 may be formed in the photosensitive area 100P, and the plurality of photosensitive units 110 may be used to receive optical signals to convert the optical signals into electrical signals. In one embodiment, the photosensitive area 100P may be a pixel area, and each photosensitive unit 110 may be a pixel unit.

The lead area 100N may be used for wiring and forming leads to achieve electrical connection between the plurality of photosensitive unit 110 or other device structures and external circuits. In this embodiment, the first lead area 100N1 may surround the photosensitive area 100P, and the second lead area 100N2 may surround the first lead area 100N1.

In one embodiment, the photoelectric sensor may include: a pixel substrate 100, including a first surface 101 and a second surface 102 opposite to each other; a plurality of photosensitive units 110 formed in the pixel substrate 100 of the photosensitive area 100P; isolation structures 160 in the pixel substrate 100 between the plurality of photosensitive units 110 and exposed by the second surface 102 of the pixel substrate 100, each of which includes a conductive layer 140; a plurality of interconnection structures 60 distributed in the pixel substrate 100, which have ends exposed on the second surface 102 and include first interconnection structures 60(1) located in the first lead area 100N1 and second interconnection structures 60(2) located in the second lead area 100N2 electrically connected to the first interconnection structure 60(1); a metal grid 210 located on the conductive layers 140 on the second surface 102 and in contact with the conductive layers 140; a connection layer 220 located on the second surface 102 of the first lead area 100N1 and in contact with the metal grid 210 and the first interconnection structures 60(1), which electrically connects the metal grid 210 and the first interconnection structures 60(1); and a pad layer 70 located on the second surface 102 of the lead area 100N. A thickness of the pad layer 70 may be larger than a thickness of the connection layer 220 and the metal grid 210. The pad layer 70 may include a first pad layer 70(1) located in the second lead area 100N2 and in contact with ends of the second interconnect structure 60(2) facing the second surface 102.

The pixel substrate 100 may be used to provide an operating platform for the formation of the photoelectric sensor.

The plurality of photosensitive units 110 may be formed in the photosensitive area 100P, and the plurality of photosensitive units 110 may be used to receive optical signals such that the optical signals are converted into electrical signals. In one embodiment, the photosensitive area 100P may be a pixel area, and each photosensitive unit 110 may be a pixel unit.

In one embodiment, each photosensitive unit 110 may include an optoelectronic device 115. In one embodiment, the optoelectronic device 115 may be a single-photon avalanche diode (SPAD) 115. In other embodiments, the plurality of photosensitive units 110 may also include other types of optoelectronic devices.

In one embodiment, the first surface 101 of the pixel substrate 100 may be the front surface, and the second surface 102 may be the back surface. In one embodiment, the pixel substrate 100 may be a backside illumination (BSI) pixel wafer, and the second surface 102 of the pixel substrate 100 may be a light-receiving surface.

In one embodiment, the pixel substrate 100 may further include: a metal interconnection line 50 located on a side of the pixel substrate 100 close to the first surface 101. The metal interconnection line 50 may be in contact with ends of the first interconnection structures 60(1) facing the first surface 101 and ends of the second interconnection structures 60(2) facing the first surface 101. The metal interconnection line 50 may electrically connect the first interconnection structures 60(1) and the second interconnect structures 60(2).

In one embodiment, along the direction from the first surface 101 to the second surface 102, the pixel substrate 100 may include a rear-end pixel interconnect layer 30 and a front-end pixel device layer 40 stacked in sequence.

In one embodiment, a plurality of interconnect layers (not shown) may be formed in the rear-end pixel interconnect layer 30 for realizing electrical connections between device structures. The plurality of photosensitive units 110 may be formed in the front-end pixel device layer 40.

In one embodiment, the metal interconnection line 50 may be located in the rear-end pixel interconnection layer 30.

In one embodiment, the photoelectric sensor may further include: a logic substrate 200 including a bonding surface 201. The bonding surface 201 of the logic substrate 200 may be bonded to the first surface 101 of the pixel substrate 100; and logic devices may be formed in the logic substrate 200.

The logic substrate 200 may be used as a logic wafer for analyzing and processing the electrical signals provided by the pixel substrate 100. In one embodiment, the logic devices may be formed in the logic substrate 200, and may be used to analyze and process the electrical signals provided by the pixel substrate 100.

The bonding surface 201 may be used to achieve bonding with the pixel substrate 100.

In one embodiment, the logic substrate 200 may include a front-end logic device layer (not labeled) and a rear-end logic interconnection layer (not labeled) located on the front-end logic device layer. The bonding surface 201 may be a side of the rear-end logic interconnection layer opposite to the front-end logic device layer.

The logic devices may be formed in the front-end logic device layer. A plurality of interconnection layers may be formed in the rear-end logic interconnection layer to realize electrical connection between the logic devices and external circuits or other device structures.

In the present disclosure, by arranging the pixel area (i.e., the photosensitive area) and the logic area on different substrates respectively, and bonding the pixel substrate 100 and the logic substrate 200 together, the pixel area may be increased and the path by which light reaches the photoelectric sensor may be shortened. The scattering of light may be reduced such that the light may be more focused, thereby improving the photosensitive ability of the photoelectric sensor in low-light environments and reducing system noise and crosstalk.

In one embodiment, the bonding between the bonding surface 201 of the logic substrate 200 and the first surface 101 of the pixel substrate 100 may be achieved through hybrid bonding.

It should be noted that the above bonding method between the pixel substrate 100 and the logic substrate 200 is only an example, and the bonding method between the pixel substrate 100 and the logic substrate 200 is not limited thereto. For example: in other embodiments, the bonding method of the pixel substrate and the logic substrate may also be direct bonding (such as fusion bonding or anodic bonding) or indirect bonding (such as metal eutectic, thermal pressure bonding or adhesive bonding), etc.

The isolation structures 160 may be used to reduce optical crosstalk and electrical crosstalk between adjacent photosensitive units 110. In one embodiment, the isolation structures 160 may be a deep trench isolation (DTI) structure.

In one embodiment, each isolation structure 160 may include one conductive layer 140, such that a voltage may be subsequently applied to the conductive layer 140 to accumulate holes at the interface between the isolation structure 160 and the pixel substrate 100, which is beneficial to reducing the dark count of the photoelectric sensor.

An end of each conductive layer 140 may be exposed on the second surface 102 such that the metal grid 210 is able to contact the end of the conductive layer 140 exposed on the second surface 102. Therefore, the electrical properties of the conductive layer 140 may be led out through the metal grid 210.

In one embodiment, the conductive layers 140 may be made of a metal material. The conductive layers 140 may be made of a material including one or more of tungsten, titanium, titanium nitride, tantalum nitride, or copper. In this embodiment, the material of the conductive layers 140 may be tungsten. Compared with other metal materials, tungsten is not easy to diffuse and has excellent hole-filling ability. Therefore, tungsten is more suitable for application in deep trenches of photoelectric sensors. Further, tungsten is an opaque metal material and is able to play a role in isolating light, which is beneficial to making the isolation structure 160 more effective in reducing optical crosstalk between adjacent photosensitive units 110.

In one embodiment, each isolation structure 160 may include one conductive layer 140 and an insulating layer 150 located between the conductive layer 140 and the pixel substrate 100. The insulating layer 150 may be used to achieve insulation between the conductive layer 140 and the pixel substrate 100.

In various embodiment, the insulating layer 150 may be made of a material including one or more of silicon oxide, silicon oxynitride, silicon nitride, aluminum oxide, or tantalum oxide.

In this embodiment, isolation trenches (not labeled) may be formed in the pixel substrate 100 between the plurality of photosensitive units 110, and the isolation structures 160 may be located in the isolation trenches. Each insulating layer 150 may be located on the sidewalls and a bottom of one corresponding isolation trench.

The interconnection structures 60 may be used to realize electrical connection between the film structures in the pixel substrate 100 and external circuits.

In one embodiment, the interconnection structures 60 may penetrate the front-end pixel device layer 40 and may be also located in part of the thickness of the rear-end pixel interconnection layer 30.

In this embodiment, the interconnection structures 60 may be through silicon via (TSV) interconnection structures. The TSV interconnection structures may be able to realize circuit conduction in the vertical direction, maximize the stacking density in the three-dimensional direction, and reduce the horizontal area of the chip. Further, the TSV interconnection structures may have the characteristics of short connection distance and high strength, which is beneficial to thinness and miniaturization of the device and also beneficial to reducing power consumption and increasing operating speed.

In this embodiment, the interconnection structures 60 may be made of a conductive material including one or more of copper, tungsten, cobalt, nickel, titanium, tantalum, titanium nitride or tantalum nitride.

The second interconnection structures 60(2) and the first interconnection structures 60(1) may be electrically connected to realize the electrical connection between the connection layer 220 and the first pad layer 70(1) located in the second lead area 100N2.

It should be noted that the number of the second interconnect structures 60(2) corresponding to the first pad layer 70(1) may be one or more. When the number of the second interconnect structures 60(2) corresponding to the first pad layer 70(1) is multiple, the first pad layer 70(1) may simultaneously contact the multiple second interconnect structures 60(2), to realize the electrical connection with the first interconnection structures 60(1), the connection layer 220, the metal grid 210 and the isolation structure 160. The resistance of the second interconnection structures 60(2) may be reduced, improving the electrical connection efficiency between the first pad layer 70(1) and the isolation structure 160.

In this embodiment, the first interconnection structures 60(1) and the second interconnection structures 60(2) may be in contact with the metal interconnection line 50, and the first interconnection structures 60(1) and the second interconnection structures 60(2) may be electrically connected through the metal interconnection lines 50.

It should be noted that the distance d1 between the first interconnection structures 60(1) and the isolation structure 160 along the direction parallel to the first surface 101 should not be too small or too large. When the distance d1 is too small, the process difficulty of TSV and DTI production may be easily increased, compressing the safe process window. When the distance d1 is too large, the chip area may be wasted, and also the connection layer 220 may be too long, resulting in excessive resistance of the connection layer 220. For this reason, in this embodiment, the distance d1 between the first interconnection structures 60(1) and the isolation structure 160 may be set to 10 μm to 50 μm along the direction parallel to the first surface 101.

It should also be noted that the distance d2 between the first interconnection structures 60(1) and the second interconnection structures 60(2) along the direction parallel to the first surface 101 should not be too small or too large. When the distance d2 is too small, it may easily lead to a short circuit problem between the first interconnection structures 60(1) and the first pad layer 70(1). When the distance d2 is too large, it may easily lead to the metal interconnection line 50 being too long to have excessive resistance. For this reason, in this embodiment, the distance d2 between the first interconnection structures 60(1) and the second interconnection structures 60(2) in the direction parallel to the first surface 101 may be set to 10 μm to 50 μm.

In this embodiment, the interconnection structures 60 may further includes third interconnection structures 60(3) located in the pixel substrate 100 of the second lead area 100N2 and may be spaced apart from the second interconnection structures 60(2). The third interconnection structures 60(3) may be electrically connected to the logic devices.

The third interconnection structures 60(3) may be electrically connected to the logic devices, to lead out the electrical properties of the logic devices for the electrical connection between the logic devices and external circuits.

Along the direction parallel to the first surface 101, the distance d3 between the second interconnection structures 60(2) and the third interconnection structures 60(3) should not be too small or be too large. When the distance d3 is too small, the distance between the first pad layer 70(1) and the second pad layer 70(2) may be too small, which may affect subsequent packaging testing. When the distance d3 is too large, too much chip area may be occupied easily. For this reason, in this embodiment, the distance d3 between the second interconnection structures 60(2) and the third interconnection structures 60(3) in the direction parallel to the first surface 101 may be set to 30 μm to 100 μm.

In some embodiments, the third distance d3 may also depend on the spacing between the pad layer, that is, depend on the requirements of the packaging process.

The metal grid 210 may be in contact with the conductive layers 140 and may be used to realize electrical connection between the conductive layers 140 and the connection layer 220.

In this embodiment, the metal grid 210 may be located on the second surface 103 and in contact with the conductive layers 140 in the isolation structures 160, that is, the metal grid 210 may be located on the back side of the pixel substrate 100, and may be a backside metal grid (BMG).

The metal grid 210 may be a grid structure and may be used to separate pixels, which is equivalent to selecting a specific pixel for each incident photon.

The metal grid 210 may have a grid structure, and the line width of the metal grid 210 may be usually small. The metal grid 210 may be formed by a process including a patterning process. To facilitate the patterning process for forming the metal grid 210 with smaller line width and higher dimensional accuracy, the metal grid 210 may generally have a small thickness in a direction perpendicular to the surface of the pixel substrate 100.

The metal grid 210 may be made of a metal material, such as one or more of aluminum or tungsten. In other embodiments, the metal grid may be made of other metals that can be etched.

The connection layer 220 may be in contact with the metal grid 210 and the first interconnection structures 60(1). And the metal grid 210 may be in contact with the conductive layers 140. Therefore, through the metal grid 210, the connection layer 220, the first interconnection structures 60(1) and the second interconnection structure 60(2) connected in sequence, the conductive layers 140 in the isolation structures 160 may be connected to the first pad layer 70(1). Accordingly, a voltage may be able to be applied to isolation structures 160 through the metal grid, to reduce the dark count of the photoelectric sensor.

In one embodiment, the isolation structures 160 may be located in the isolation trenches. During the formation process of the photoelectric sensor, the isolation trenches may be usually formed through an etching process. During the etching process, etching defects may often occur on the sidewalls and bottom walls of trenches. Accordingly, after the isolation structures 160 is formed, defects may be likely to occur at the interface between the isolation structures 160 and the pixel substrate 100.

In this embodiment, a suitable voltage may be applied to the isolation structures 160 by applying voltage, such that more holes accumulate at the interface between the isolation structures 160 and the pixel substrate 100. When an optoelectronic device (for example, SPAD) in one photosensitive unit 110 operate, a distance between the depletion area of the optoelectronic device and the interface between one corresponding isolation structure 160 and the pixel substrate 100 may be increased, thereby reduce the contribution of the defects at the interface on the dark count. The dark count of the photoelectric sensor may be reduced, improving the performance of the photoelectric sensor.

In this embodiment, the connection layer 220 and the metal grid 210 may be formed in the same process, which is beneficial to simplifying the process flow and improving process integration. The connection layer 220 and the metal grid 210 may have the same thickness.

Correspondingly, in this embodiment, the connection layer 220 and the metal grid 210 may have an integrated structure, which is beneficial to improving the electrical connection performance of the connection layer 220 and the metal grid 210 and reducing the resistance of the connection layer 220 and the metal grid 210. Therefore, the connection layer 220 and the metal grid 210 may be made of a same material.

The pad layer 70 may be used to realize electrical connection between the photoelectric sensor and external circuits or other device structures. The pad layer 70 may be also used to provide a process basis for forming the electrical connection structure (for example, wiring).

The pad layer 70 may be made of a material including a conductive material. In one embodiment, the pad layer 70 may be made of a metal, including one or more of aluminum, titanium, gold, or indium tin oxide (ITO). In this embodiment, the material of the pad layer 70 may be aluminum. Aluminum is a metal material that is easy to obtain, which is beneficial to saving costs. Also, aluminum is a metal material that is easy to etch, and it may be easy to be patterned to form the pad layer 70.

The first pad layer 70(1) may be in contact with the ends of the second interconnection structures 60(2) facing the second surface 102, such that the conductive layers 140 in the isolation structures 160 are connected to the first pad layer 70(1), through the metal grid 210, the connection layer 20, the first interconnection structures 60(1) and the second interconnection structures 60(2) connected in sequence.

Further, the first pad layer 70(1) and the metal grid may be formed in different processes, and the first pad layer 70(1) may be formed using a pad layer process in the lead area 100N, such that the first pad layer 70(1) has a relatively large thickness and has a good height consistency with other pad layer 70 in the lead area 100N, which is beneficial to reducing the process risk because of the height inconsistency of the pad layer 70 or the too thin first pad layer 70(1). Therefore, the difficulty of the packaging and testing process may be reduced, and the performance of the photoelectric sensor may be improved.

In this embodiment, the number of the pad layer 70 may be multiple, and the pad layer 70 may further include a second pad layer 70(2) located in the second lead area 100N2 and connected with ends of the third interconnection structures 60(3) facing the second surface 102. The second pad layer 70(2) may be electrically connected to the third interconnection structures 60(3), to realize electrical connection between the logic devices and external circuits or other device structures. The second pad layer 70(2) may be spaced apart from the first pad layer 70(1).

In this embodiment, the photoelectric sensor may further include: a passivation layer 230 located on the second surface 102 of the pixel substrate 100. The passivation layer 230 may cover the connection layer 220 and the metal grid 210, and may be also disposed between the pad layer 70. A top surface of the passivation layer 230 located in the second lead area 100N2 may be higher than the top surface of the passivation layer 230 located in the first lead area 100N1 and the photosensitive area 100P.

The passivation layer 230 may be used to protect the metal grid 210 and the connection layer 220.

In this embodiment, the passivation layer 230 may also expose the pad layer 70 to provide a process basis for forming an electrical connection structure in contact with the pad layer 70.

The top surface of the passivation layer 230 located in the second lead area 100N2 may be higher than the top surface of the passivation layer 230 located in the first lead area 100N1 and the photosensitive area 100P, such that the dielectric material located in the photosensitive area 100P and the first lead area 100N1 is thinner, which is beneficial to making the optical path in one pixel shorter. Therefore, the light detection efficiency may be higher, improving the performance of the photoelectric sensor.

As an example, in one embodiment, the passivation layer 230 may be a stacked structure. The passivation layer 230 may include: a first dielectric layer 170 located on the second surface 102 and below the pad layer 70, the connection layer 220 and the metal grid 210; a second dielectric layer 180 located on the first dielectric layer 170 of the second lead area 100N2, where the second dielectric layer 180 is located between the pad layer 70; and a top dielectric layer 195 on the second dielectric layers 180 and on the first dielectric layer 170 in the first lead area 100N1 and the photosensitive area 100P. The top dielectric layer 196 may cover the metal grid 210 and the connection layer 220.

The first dielectric layer 170 and the second dielectric layer 180 may constitute a bottom dielectric layer 190.

In this embodiment, the first dielectric layer 170, the second dielectric layer 180 and the top dielectric layer 195 may be made of a material including one or more of silicon oxide or silicon nitride.

The present disclosure also provides a fabrication method of a photoelectric sensor. FIG. 3 to FIG. 10 illustrate structures corresponding to certain stages of an exemplary fabrication method of a photoelectric sensor provided by one embodiment of the present disclosure.

As an example, in this embodiment, the photoelectric sensor is a time of flight (TOF) sensor. More specifically, the photoelectric sensor may be a direct time of flight (DTOF) sensor. In some other embodiments, the photoelectric sensor may also be an indirect time of flight (iTOF) sensor.

In some other embodiments, the photoelectric sensor may also be a charge coupled device (CDD) image sensor, a CMOS image sensor, or other types of photoelectric sensors.

The fabrication method of the photoelectric sensor will be described in detail with reference to the drawings.

Figure 3:
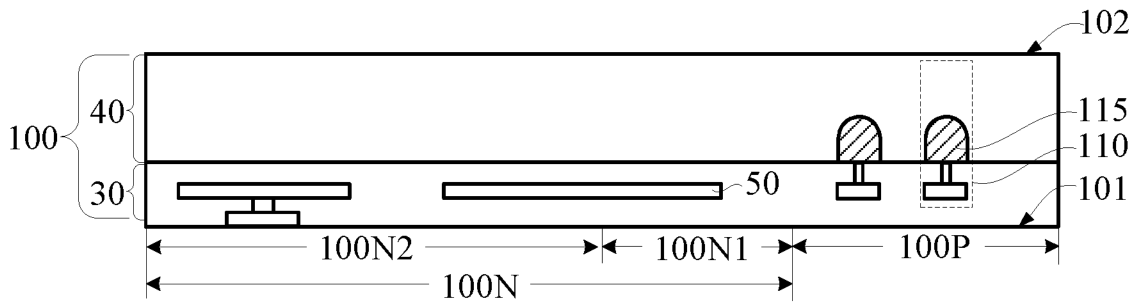
FIG. 3 to FIG. 10 illustrate structures corresponding to certain stages of a fabrication method of a photoelectric sensor according to various disclosed embodiments of the present disclosure.

As shown in FIG. 3, a pixel substrate 100 may be provided. The pixel substrate 100 may include a first surface 101 and a second surface 102 opposite to each other. The pixel substrate 100 may include a photosensitive area 100P and a lead area 100N surrounding the photosensitive area 100P. A plurality of photosensitive units 110 may be formed in the pixel substrate 100 in the photosensitive area 100P. The lead area 100N may include a first lead area 100N1 and a second lead area 100N2 surrounding the first lead area 100N1.

The pixel substrate 100 may be used to provide an operating platform for the formation of the photoelectric sensor.

The pixel substrate 100 may include the photosensitive area 100P, and the plurality of photosensitive units 110 may be formed in the photosensitive area 100P. The plurality of photosensitive units 110 may be used to receive optical signals such that the optical signals are converted into electrical signals. In one embodiment, the photosensitive area 100P may be a pixel area, and each photosensitive unit 110 may be a pixel unit.

In one embodiment, each photosensitive unit 110 may include an optoelectronic device 115. In one embodiment, one optoelectronic device 115 may be a single-photon avalanche diode (SPAD) 115. In other embodiments, the plurality of photosensitive units 110 may also include other types of optoelectronic devices.

The lead area 100N may be used for wiring and forming leads to achieve electrical connection between the plurality of photosensitive unit 110 or other device structures and external circuits.

In this embodiment, the first lead area 100N1 may surround the photosensitive area 100P, and the second lead area 100N2 may surround the first lead area 100N1.

In one embodiment, the first surface 101 of the pixel substrate 100 may be the front surface, and the second surface 102 may be the back surface. In one embodiment, the pixel substrate 100 may be a backside illumination (BSI) pixel wafer, and the second surface 102 of the pixel substrate 100 may be a light-receiving surface.

In one embodiment, a metal interconnection line 50 may be formed in a side of the pixel substrate 100 close to the first surface 101. Subsequently first interconnection structures may be formed in the pixel substrate 100 in the first lead area 100N1 and second interconnection structures may be formed in the pixel substrate 100 in the second lead area 100N2. The metal interconnection line 50 may electrically connect the first interconnection structures and the second interconnect structures.

In one embodiment, when providing the pixel substrate 100, along the direction from the first surface 101 to the second surface 102, the pixel substrate 100 may include a rear-end pixel interconnect layer 30 and a front-end pixel device layer 40 stacked in sequence.

In one embodiment, a plurality of interconnection layers (not shown) may be formed in the rear-end pixel interconnect layer 30 for realizing electrical connections between device structures. The plurality of photosensitive units 110 may be formed in the front-end pixel device layer 40.

In one embodiment, the metal interconnection line 50 may be located in the rear-end pixel interconnection layer 30.

Figure 4:
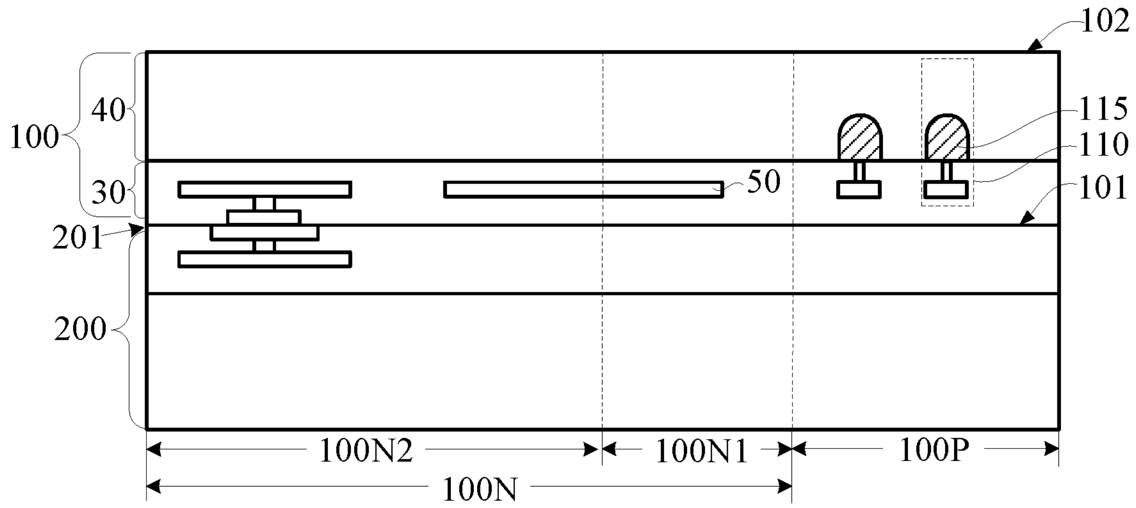

As shown in FIG. 4, after providing the pixel substrate 100, the fabrication method of the photoelectric sensor may further include providing a logic substrate 200. The logic substrate 200 may include a bonding surface 201, and logic devices may be formed in the logic substrate 200.

The logic substrate 200 may be used as a logic wafer for analyzing and processing the electrical signals provided by the pixel substrate 100. In one embodiment, the logic devices may be formed in the logic substrate 200, and may be used to analyze and process the electrical signals provided by the pixel substrate 100.

The bonding surface 201 may be used to achieve bonding with the pixel substrate 100.

In one embodiment, the logic substrate 200 may include a front-end logic device layer (not labeled) and a rear-end logic interconnection layer (not labeled) located on the front-end logic device layer. The bonding surface 201 may be a side of the rear-end logic interconnection layer opposite to the front-end logic device layer.

The logic devices may be formed in the front-end logic device layer. A plurality of interconnection layers may be formed in the rear-end logic interconnection layer to realize electrical connection between the logic devices and external circuits or other device structures.

As shown in FIG. 4, the bonding surface 201 of the logic substrate 200 may be bonded to the first surface 101 of the pixel substrate 100.

In the present disclosure, by arranging the pixel area (i.e., the photosensitive area) and the logic area on different substrates respectively, and bonding the pixel substrate 100 and the logic substrate 200 together, the pixel area may be increased and the path by which light reaches the photoelectric sensor may be shortened. The scattering of light may be reduced such that the light may be more focused, thereby improving the photosensitive ability of the photoelectric sensor in low-light environments and reducing system noise and crosstalk.

In one embodiment, the bonding between the bonding surface 201 of the logic substrate 200 and the first surface 101 of the pixel substrate 100 may be achieved through hybrid bonding.

It should be noted that the above bonding method between the pixel substrate 100 and the logic substrate 200 is only an example, and the bonding method between the pixel substrate 100 and the logic substrate 200 is not limited thereto. For example: in other embodiments, the bonding method of the pixel substrate and the logic substrate may also be direct bonding (such as fusion bonding or anodic bonding) or indirect bonding (such as metal eutectic, thermal pressure bonding or adhesive bonding), etc.

In one embodiment, the fabrication method of the photoelectric sensor may further include: after bonding the bonding surface 201 of the logic substrate 200 with the first surface 101 of the pixel substrate 100, thinning the second surface 102 of the pixel substrate 100.

By thinning the second surface 102 of the pixel substrate 100, the thickness of he pixel substrate 100 may be reduced, reducing the overall thickness of the photoelectric sensor.

In one embodiment, thinning the second surface 102 of the pixel substrate 100 may include a grinding process, a wet etching process, and a chemical mechanical planarizing process performed in sequence.

Figure 5:
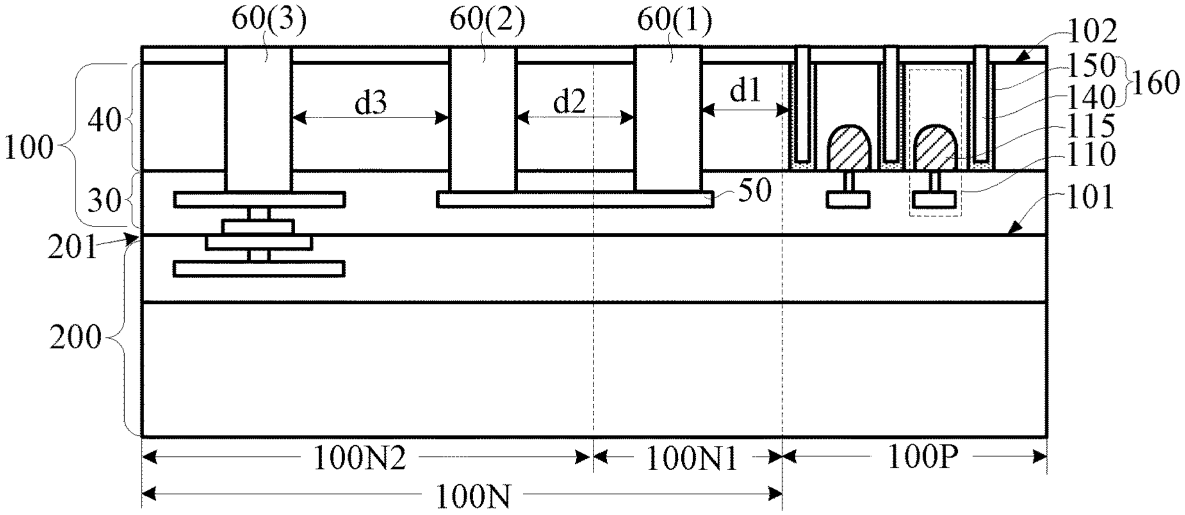

As shown in FIG. 5, isolation structures 160 may be formed in the pixel substrate 100 between the plurality of photosensitive units 110. One end of each isolation structure 160 may be exposed from the second surface 102 of the pixel substrate 100. Each isolation structure 160 may include a conductive layer 140.

The isolation structures 160 may be used to reduce optical crosstalk and electrical crosstalk between adjacent photosensitive units 110.

In one embodiment, each isolation structure 160 may be a deep trench isolation (DTI) structure.

In one embodiment, each isolation structure 160 may include one conductive layer 140, such that a voltage may be subsequently applied to the conductive layer 140 to accumulate holes at the interface between the isolation structure 150 and the pixel substrate 100, which is beneficial to reducing the dark count of the photoelectric sensor.

One end of each conductive layer 140 may be exposed on the second surface 102 such that the metal grid 210 in contact with the conductive layer 140 may be formed on the second surface. Therefore, the electrical properties of the conductive layer 140 may be led out through the metal grid 210.

In one embodiment, the conductive layers 140 may be made of a metal material. The conductive layers 140 may be made of a material including one or more of tungsten, titanium, titanium nitride, tantalum nitride, or copper. In this embodiment, the material of the conductive layers 140 may be tungsten. Compared with other metal materials, tungsten is not easy to diffuse and has excellent hole-filling ability. Therefore, tungsten is more suitable for application in deep trenches of photoelectric sensors. Further, tungsten is an opaque metal material and is able to play a role in isolating light, which is beneficial to making the isolation structures 160 more effective in reducing optical crosstalk between adjacent photosensitive units 110.

In one embodiment, each isolation structure 160 may include one corresponding conductive layer 140 and an insulating layer 150 located between the conductive layer 140 and the pixel substrate 100. The insulating layer 150 may be used to achieve insulation between the conductive layer 140 and the pixel substrate 100.

In various embodiments, the insulating layer 150 may be made of a material including one or more of silicon oxide, silicon oxynitride, silicon nitride, aluminum oxide, or tantalum oxide.

In one embodiment, forming the isolation structures 160 may include: forming isolation trenches (not labeled) in the pixel substrate 100 between the plurality of photosensitive units 110, and forming one insulating layer 150 on sidewalls and a bottom of each isolation trench and one conductive layer 140 on the insulating layer 150 to fill the isolation trench.

As shown in FIG. 5, a plurality of interconnection structures 60 may be formed. The plurality of interconnection structures 60 may be distributed in the pixel substrate 100, and have ends exposed on the second surface 102. The plurality of interconnection structures 60 may include first interconnection structures 60(1) located in the first lead area 100N1 and second interconnection structures 60(2) located in the second lead area 100N2. The second interconnection structures 60(2) may be electrically connected to the first interconnection structure 60(1).

The plurality of interconnection structures 60 may be used to realize electrical connection between the film structure in the pixel substrate 100 and external circuits. In one embodiment, the plurality of interconnection structures 60 may penetrate the front-end pixel device layer 130 and may be also located in part of the thickness of the rear-end pixel interconnection layer 120.

In this embodiment, the plurality of interconnection structures 60 may be through silicon via (TSV) interconnection structures. The TSV interconnection structures may be able to realize circuit conduction in the vertical direction, maximize the stacking density in the three-dimensional direction, and reduce the horizontal area of the chip. Further, the TSV interconnection structures may have the characteristics of short connection distance and high strength, which is beneficial to thinness and miniaturization of the device and also beneficial to reducing power consumption and increasing operating speed.

In this embodiment, the plurality of interconnection structures 60 may be made of a conductive material including one or more of copper, tungsten, cobalt, nickel, titanium, tantalum, titanium nitride or tantalum nitride.

The second interconnection structures 60(2) and the first interconnection structures 60(1) may be electrically connected to realize the electrical connection between a subsequently formed connection layer and a first pad layer located in the second lead area 100N2.

The subsequently formed first pad layer may be in contact with ends of the second interconnection structures 60(2) facing the second surface 102. It should be noted that the number of the second interconnect structures 60(2) corresponding to the first pad layer 70 may be one or more. When the number of the second interconnect structures 60(2) corresponding to the first pad layer is multiple, the first pad layer may simultaneously contact the multiple second interconnect structures 60(2), to realize the electrical connection with the first interconnection structures 60(1), the connection layer, the metal grid and the isolation structures 160. The resistance of the second interconnection structures 60(2) may be reduced, improving the electrical connection efficiency between the first pad layer and the isolation structure 160.

In this embodiment, the first interconnection structures 60(1) and the second interconnection structures 60(2) may be in contact with the metal interconnection line 50, and the first interconnection structures 60(1) and the second interconnection structures 60(2) may be electrically connected through the metal interconnection line 50.

It should be noted that the distance d1 between the first interconnection structures 60(1) and the isolation structure 160 along the direction parallel to the first surface 101 should not be too small or too large. When the distance d1 is too small, the process difficulty of TSV and DTI production may be easily increased, compressing the safe process window. When the distance d1 is too large, the chip area may be wasted, and also the connection layer 220 may be too long, resulting in excessive resistance of the connection layer 220. For this reason, in this embodiment, the distance d1 between the first interconnection structures 60(1) and the isolation structure 160 may be set to 10 μm to 50 μm along the direction parallel to the first surface 101.

It should also be noted that the distance d2 between the first interconnection structures 60(1) and the second interconnection structures 60(2) along the direction parallel to the first surface 101 should not be too small or too large. When the distance d2 is too small, it may easily lead to a short circuit problem between the first interconnection structures 60(1) and the first pad layer 70(1). When the distance d2 is too large, it may easily lead to the metal interconnection line 50 being too long to have excessive resistance. For this reason, in this embodiment, the distance d2 between the first interconnection structures 60(1) and the second interconnection structures 60(2) in the direction parallel to the first surface 101 may be set to 10 μm to 50 μm.

In this embodiment, the plurality of interconnection structures 60 may further include third interconnection structures 60(3) located in the pixel substrate 100 of the second lead area 100N2 and may be spaced apart from the second interconnection structures 60(2). The third interconnection structures 60(3) may be electrically connected to the logic devices.

The third interconnection structures 60(3) may be electrically connected to the logic devices, to lead out the electrical properties of the logic device for the electrical connection between the logic devices and external circuits.

In one embodiment, the first interconnection structures 60(1) and the second interconnection structures 60(2) may be formed in a process for forming the third interconnection structures 60(3). Therefore, the process of forming the third interconnection structures 60(3) may be used to form the first interconnection structures 60(1) and the second interconnection structures 60(2) without introducing additional process steps. The modification on the existing process flow and process risks may be reduced. The process flow may be simplified, and process integration may be improved, saving process costs.

Along the direction parallel to the first surface 101, the distance d3 between the second interconnection structures 60(2) and the third interconnection structures 60(3) should not be too small or be too large. When the distance d3 is too small, the distance between the first pad layer 70(1) and the second pad layer 70(2) may be too small, which may affect subsequent packaging testing. When the distance d3 is too large, too much chip area may be occupied easily. For this reason, in this embodiment, the distance d3 between the second interconnection structures 60(2) and the third interconnection structures 60(3) in the direction parallel to the first surface 101 may be set to 30 μm to 100 μm.

In some embodiments, the third distance d3 may also depend on the spacing between the pad layer, that is, depend on the requirements of the packaging process.

In this embodiment, forming the plurality of interconnection structures 60 may include: forming a plurality of interconnection via holes (not shown) in the pixel substrate 100; and filling the plurality of interconnection structures in the plurality of interconnection via holes. 60.

Accordingly, in the process of forming the plurality of interconnection via holes, only the pattern of the photomask forming the plurality of interconnection via holes may need to be modified such that the plurality of interconnection via holes includes first interconnection via holes and second interconnection via holes corresponding to the first interconnection structures and the second interconnection structures respectively. Therefore, the need to use an additional photomask in the process of forming the first interconnection structures and the second interconnection structures may be eliminated, which is beneficial to reducing process costs.

It should be noted that in this embodiment, after forming the plurality of interconnection via holes and before filling the plurality of interconnection structures in the plurality of interconnection via holes, the fabrication method of the photoelectric sensor may further include: forming isolation layers on the bottoms and side walls of the plurality of interconnection via holes (not shown). The isolation layers may be used to achieve insulation between the plurality of interconnection structures 60 and the pixel substrate 100. As an example, the isolation layers may be made of a material including silicon oxide, tantalum, tantalum nitride, or a combination thereof.

Figure 6:
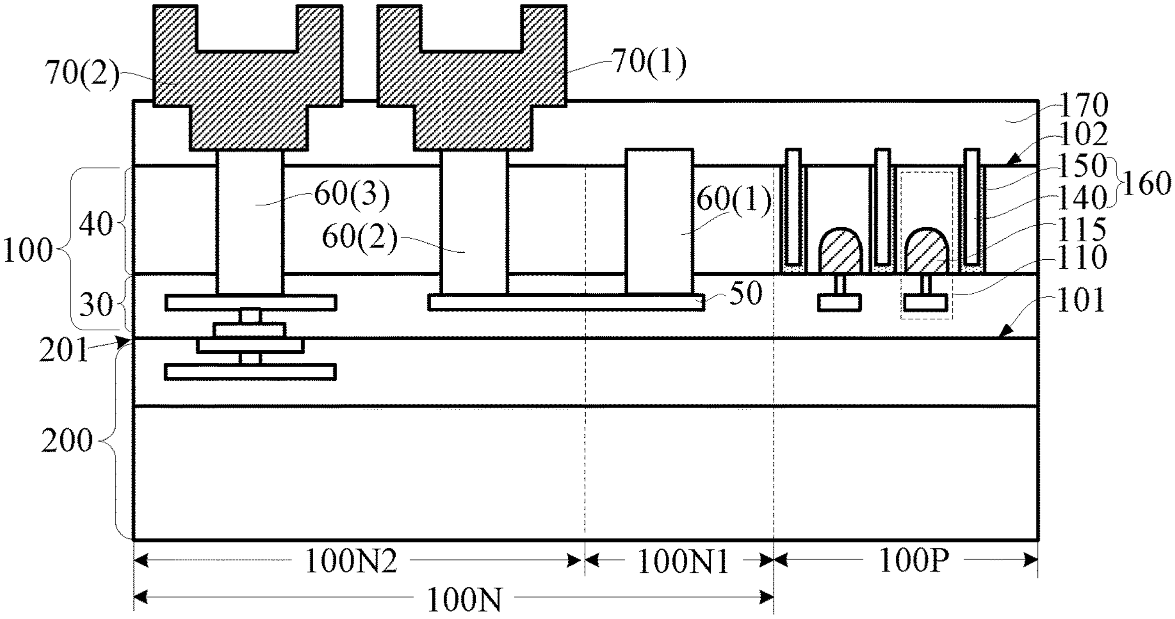

As shown in FIG. 6, a pad layer 70 may be formed on the second surface 102 of the lead area 100N. The pad layer 70 may include a first pad layer 70(1) located in the second lead area 100N2 and in contact with the ends of the second interconnect structures 60(2) facing the second surface 102.

The pad layer 70 may be used to realize electrical connection between the photoelectric sensor and external circuits or other device structures. The pad layer 70 may be also used to provide a process basis for forming the electrical connection structure (for example, wiring).

The pad layer 70 may be made of a material including a conductive material. In one embodiment, the pad layer 70 may be made of a metal, including one or more of aluminum, titanium, gold, or indium tin oxide (ITO). In this embodiment, the material of the pad layer 70 may be aluminum. Aluminum is a metal material that is easy to obtain, which is beneficial to saving costs. Also, aluminum is a metal material that is easy to etch, and it may be easy to be patterned to form the pad layer 70.

The first pad layer 70(1) may be in contact with the ends of the second interconnection structures 60(2) facing the second surface 102. Therefore, when subsequently forming a metal grid on the conductive layer on the second surface 102 and a connection layer on the second surface 102 contacting the metal grid and the first interconnection structures 60(1), the metal grid may be in contact with the conductive layer 140 and the connection layer may electrically connect the metal grid and the first interconnection structures 60(1), such that the conductive layers 140 in the isolation structures 160 are connected to the first pad layer 70(1), through the metal grid 210, the connection layer 20, the first interconnection structures 60(1) and the second interconnection structures 60(2) connected in sequence.

Further, the first pad layer 70(1) and the metal grid may be formed in different processes, and the first pad layer 70(1) may be formed using a pad layer process in the lead area 100N, such that the first pad layer 70(1) has a relatively large thickness and has a good height consistency with other pad layer 70 in the lead area 100N, which is beneficial to reducing the process risk because of the height inconsistency of the pad layer 70 or the too thin first pad layer 70(1). Therefore, the difficulty of the packaging and testing process may be reduced, and the performance of the photoelectric sensor may be improved.

In this embodiment, the number of the pad layer 70 may be multiple, and the pad layer 70 may further include the second pad layer 70(2) located in the second lead area 100N2 and connected with ends of the third interconnection structures 60(3) facing the second surface 102.

The second pad layer 70(2) may be electrically connected to the third interconnection structures 60(3), to realize electrical connection between the logic devices and external circuits or other device structures. The second pad layer 70(2) may be spaced apart from the first pad layer 70(1).

In one embodiment, forming the pad layer 70 may include: forming a first dielectric layer 170 on the second surface 102 of the pixel substrate 100 to cover the plurality of interconnection structures and the isolation structure 160; forming grooves in the first dielectric layer 170, including a first groove exposing the second interconnection structures 60(2) and a second groove exposing the third interconnection structures 60(3); forming a pad material layer on the first dielectric layer 170 and in the grooves (not shown); and patterning the pad material layer to retain a portion of the pad material layer located in the first groove as the first pad layer 70(1) and retain another portion of the pad material layer located in the second groove as the second pad layer 70(2).

In this embodiment, during the process of forming the pad layer 70, only the mask used to form the grooves and pattern the pad material layer may need to be modified to form the first pad layer 70 in contact with the second interconnection structures. There may be no need to use additional process steps and additional photomasks to form the first pad layer 70(1). The changes to the existing process flow may be small, which is beneficial to simplifying the process flow and improving the process integration and compatibility to save process costs.

As shown in FIG. 6, when forming the pad layer 70, the first dielectric layer 170 may be formed on the second surface 102 of the pixel substrate 100, to cover the isolation structure 160 and the first interconnection structures 60(1).

The first dielectric layer 170 may protect the isolation structure 160 and the first interconnection structures 60(1) when forming the pad layer 70.

In one embodiment, the first dielectric layer 170 may be made of a material including one or more of silicon oxide or silicon nitride.

Figure 7:
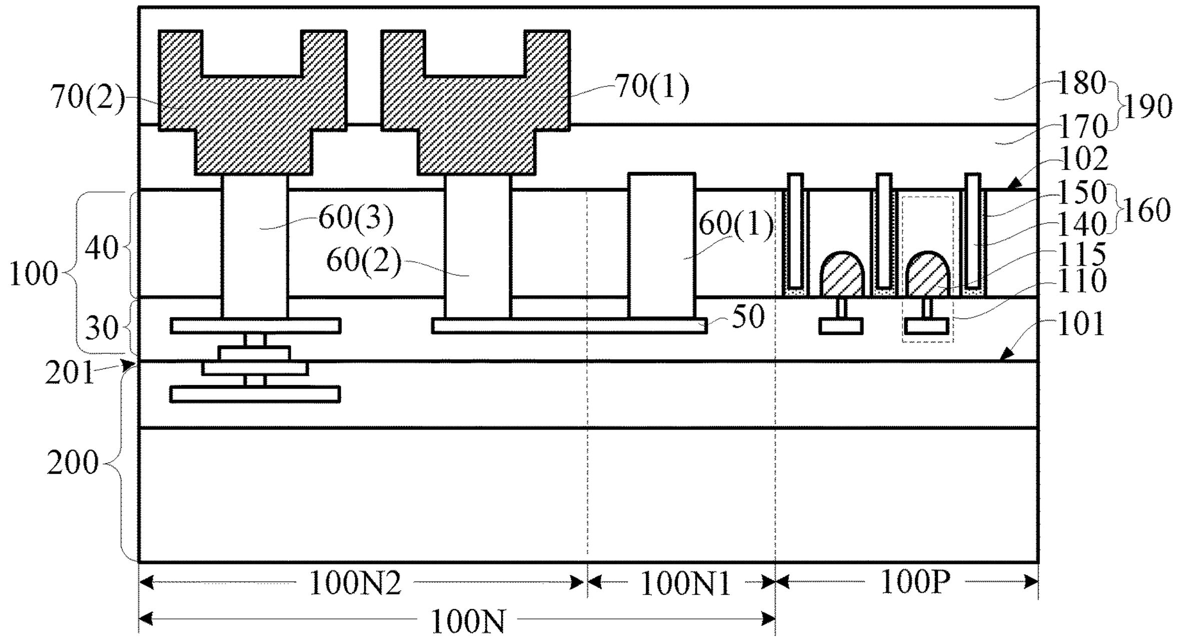

As shown in FIG. 7, the fabrication method of the photoelectric sensor may further include: after forming the pad layer 70, forming a second dielectric layer 180 on the first dielectric layer 170 to cover the pad layer 70. The first dielectric layer 170 and the second dielectric layer 180 may constitute the bottom dielectric layer 190.

The second dielectric layer 180 may protect the pad layer 70 when subsequently forming the connection layer and the metal grid.

In one embodiment, the second dielectric layer 180 may be made of a material including one or more of silicon oxide or silicon nitride.

Figure 8:
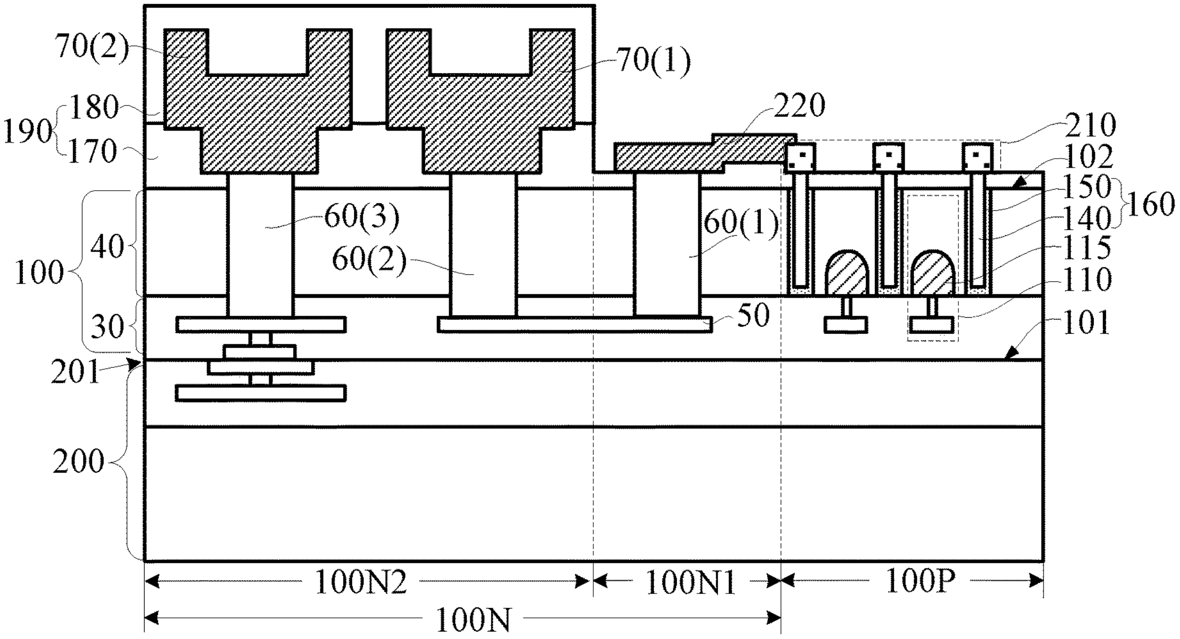

As shown in FIG. 8, a metal grid 210 located on the conductive layer 140 on the second surface 102 and a connection layer 220 located on the second surface 102 of the first lead area 100N1 may be formed in a same process. The metal grid 210 may be in contact with the conductive layer 140. The connection layer 220 may be in contact with the metal grid 210 and the first interconnection structures 60(1), to electrically connect the metal grid 210 and the first interconnection structures 60(1).

The connection layer 220 may be in contact with the metal grid 210 and the first interconnection structures 60(1), and the metal grid 210 may be in contact with the conductive layer 140. Therefore, the conductive layers 140 in the isolation structures 160 may be electrically connected to the first pad layer 70(1) through the metal grid 210, the connection layer 220, the first interconnection structures 70(1), and the second interconnection structures 70(2) connected in sequence. Correspondingly, it may be able to apply a voltage to the isolation structures 160 through the metal grid 210, to reduce the dark count of the photoelectric sensor.

In one embodiment, when forming the photoelectric sensor, the isolation structures 160 may formed by: forming isolation trenches in the pixel substrate 100 between the plurality of photosensitive units 110; and forming the isolation structures 160 in the isolation trenches. During the formation process of the photoelectric sensor, the isolation trenches may be usually formed through an etching process. During the etching process, etching defects may often occur on the sidewalls and bottoms of trenches. Accordingly, after the isolation structures 160 are formed, defects may be likely to occur at the interface between the isolation structures 160 and the pixel substrate 100.

In this embodiment, a suitable voltage may be applied to the isolation structures 160 by applying voltage, such that more holes accumulate at the interface between the isolation structures 160 and the pixel substrate 100. When an optoelectronic device (for example, SPAD) in one photosensitive unit 110 operate, a distance between the depletion area of the optoelectronic device and the interface between the isolation structures 160 and the pixel substrate 100 may be increased, thereby reduce the contribution of the defects at the interface on the dark count. The dark count of the photoelectric sensor may be reduced, improving the performance of the photoelectric sensor.

In this embodiment, the connection layer 220 and the metal grid 210 may be formed in the same process, which is beneficial to simplifying the process flow and improving process integration. The connection layer 220 and the metal grid 210 may have the same thickness.

In this embodiment, the metal grid 210 may be located on the second surface 103 and in contact with the conductive layer 140 in the isolation structure 160, that is, the metal grid 210 may be located on the back side of the pixel substrate 100, and may be a backside metal grid (BMG).

The metal grid 210 may be a grid structure and may be used to separate pixels, which is equivalent to selecting a specific pixel for each incident photon.

The metal grid 210 may have a grid structure, and the line width of the metal grid 210 may be usually small. The metal grid 210 may be formed by a process including a patterning process. To facilitate the patterning process for forming the metal grid 210 with smaller line width and higher dimensional accuracy, the metal grid 210 may generally have a small thickness in a direction perpendicular to the surface of the pixel substrate 100. The connection layer 220 and the metal grid 210 may be formed in the same process. Therefore, the connection layer 220 may also have a small thickness.

In one embodiment, the first pad layer 70(1) and the metal grid 210 may be formed in different processes, and the first pad layer 70(1) may be formed using a pad layer process in the lead area 100N, such that the first pad layer 70(1) has a relatively large thickness and has a good height consistency with other pad layer 70 in the lead area 100N, which is beneficial to reducing the process risk because of the height inconsistency of the pad layer 70 or the too thin first pad layer 70(1). Therefore, the difficulty of the packaging and testing process may be reduced, and the performance of the photoelectric sensor may be improved.

In one embodiment, the metal grid 210 and the connection layer 220 may be made of a same material. The metal grid 210 and the connection layer 220 may be made of a metal material, such as one or more of aluminum or tungsten. In other embodiments, the metal grid may be made of other metals that can be etched.

The process for forming the metal grid and the connection layer 220 will be described in detail with reference to the drawings.

As shown in FIG. 8, a portion of the thickness of the bottom dielectric layer 190 in the photosensitive area 100P and the first lead area 100N1 may be removed, to expose the first interconnection structures 60(1) and the isolation structures 160.

In one embodiment, removing the portion of the thickness of the bottom dielectric layer 190 in the photosensitive area 100P and the first lead area 100N1 to expose the first interconnection structures 60(1) and the isolation structure 160 may include: performing a first etching process on the bottom dielectric layer 190 in the photosensitive area 100P and the first lead area 100N1; after the first etching process, performing a second etching process on the bottom dielectric layer 190 on the photosensitive area 100P and the first lead area 100N1, to expose the first interconnection structures 60(1) and the isolation structures 160.

The first etching process may etch the bottom dielectric layer 190 in the photosensitive area 100P and the first lead area 100N1 downwards as a whole, to thin the thickness of the bottom dielectric layer 190 in the photosensitive area 100P and the first lead area 100N1, such that the light path in the pixels is shorter and the photosensitive efficiency is higher. In one embodiment, the first etching process may completely etch away the thickness of the whole layer of the bottom dielectric layer 190 in the photosensitive area 100P and the first lead area 100N1, such that the thickness of the bottom dielectric layer 190 may be reduced further to shorten the light path.

The second etching process may open an area above the first interconnection structures 60(1) and the isolation structure 160, to expose the first interconnection structures 60(1) and the isolation structures 160. Therefore, the connection layer and the metal grid may be connected, and the connection layer may contact the first interconnection structures 60(1), such that the metal grid may contact the conductive layers 140 of the isolation structures 160.

As shown in FIG. 8, after removing the portion of the thickness of the bottom dielectric layer 190 in the photosensitive area 100P and the first lead area 100N1, the metal grid 210 on the isolation structures 160 and contacting the conductive layers 140, and the connection layer 220 on the first interconnection structures 60(1) and connected to the metal grid 210, may be formed.

In one embodiment, a metal material layer in contact with the first interconnection structures 60(1) and the conductive layers 140 may be formed on the photosensitive area 100P and the first lead area 100N1, and then the metal material layer may be patterned to form the metal grid 210 on the isolation structures 160 and contacting the conductive layer 140, and the connection layer 220 on the first interconnection structures 60(1) and connected to the metal grid 210.

In the present disclosure, when forming the metal grid 210 and the connection layer 220, the portion of the thickness of the bottom dielectric layer 190 in the photosensitive area 100P and the first lead area 100N1 may be removed. Therefore, after forming the metal grid 210 and the connection layer 220, the top surface of the bottom dielectric layer 190 in the second lead area 100N2 may be higher than the top surface of the bottom dielectric layer 190 in the photosensitive area 100P and the first lead area 100N1.

In one embodiment, the connection layer 220 and the metal grid 210 may have an integrated structure, which is beneficial to improving the electrical connection performance of the connection layer 220 and the metal grid 210 and reducing the resistance of the connection layer 220 and the metal grid 210.

Figure 9:
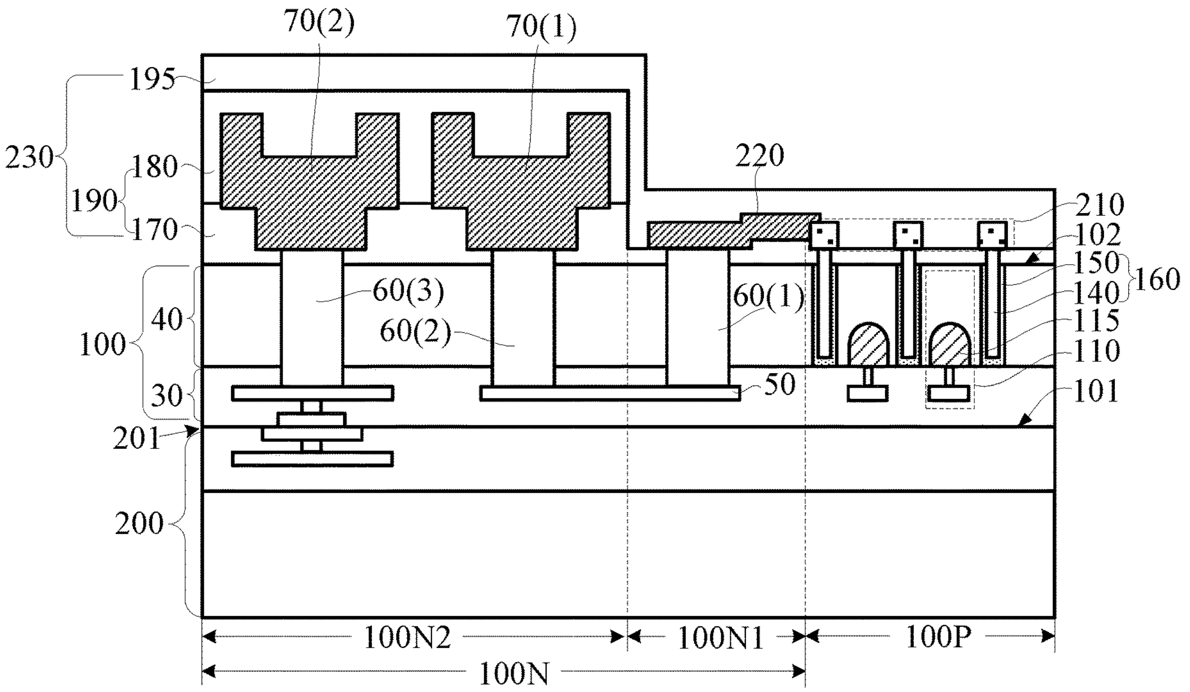

As shown in FIG. 9, after forming the metal grid 210 and the connection layer 220, the fabrication method of the photosensitive sensor may further include: forming a passivation layer 230 covering the connection layer 220, the metal grid 210, and the pad layer 70. The passivation layer 230 may be used to protect the metal grid 210 and the connection layer 220.

In one embodiment, a top dielectric layer 195 may be formed on the bottom dielectric layer 190. The top dielectric layer 195 may cover the second dielectric layer 180 in the second lead area 100N2, the metal grid 210, the connection layer 220, and the first dielectric layer 170 in the first lead area 100N1 and the photosensitive area 100P. The top dielectric layer 195 and the bottom dielectric layer 190 may be used to form the passivation layer 230.

The top dielectric layer 195 may be made of a material including silicon oxide or silicon nitride.

Figure 10:
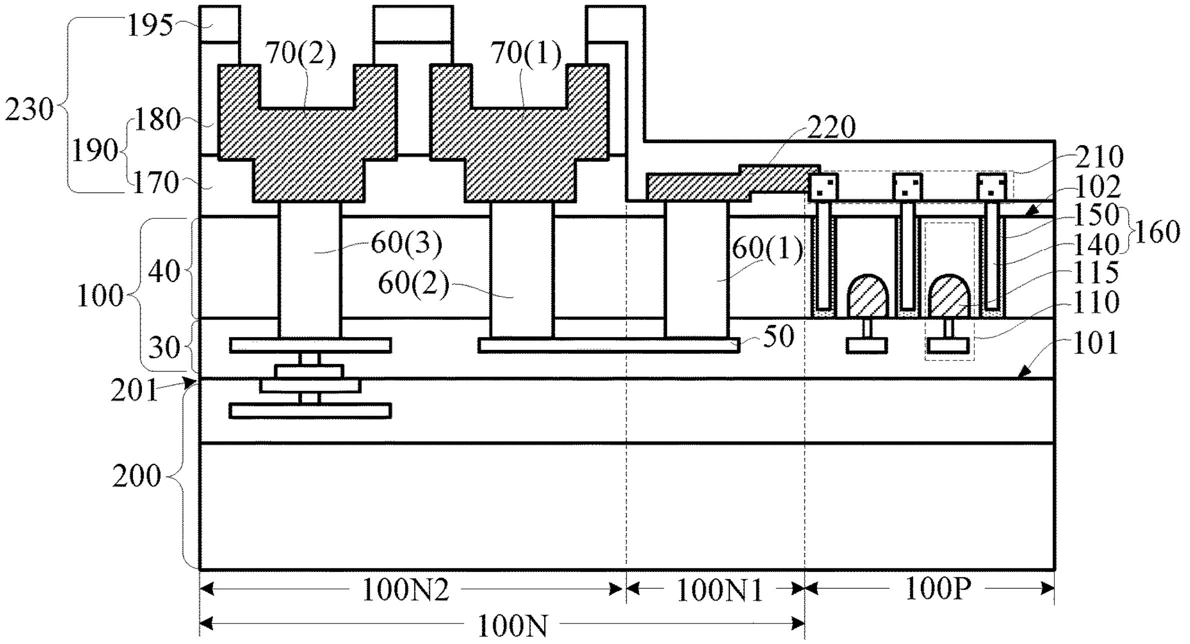

As shown in FIG. 10, a portion of the passivation layer 230 on the pad layer 70 may be removed to expose the pad layer 70, to facilitate forming electrical connection structures (such as wirings) on the pad layer 70 subsequently.

In one embodiment, the top dielectric layer 195 and the second dielectric layer 180 on the first pad layer 70(1) and the second pad layer 70(2) may be removed to expose the first pad layer 70(1) and the second pad layer 70(2).

In the present embodiment, the portion of the passivation layer 230 on the pad layer 70 may be removed to expose the pad layer 70, such that a voltage is able to be applied to the metal grid 210 and the isolation structures 160 through the first pad layer 70(1). Therefore, the dark count of the photosensitive sensor may be reduced, and the performance of the photosensitive sensor may be improved. Further, the first pad layer 70(1) may be exposed using a process for removing the portion of the passivation layer 230 on the pad layer 70. Extra process or an extra mask may not be needed. Therefore, the modification to the existing process flow may be small, which is beneficial to simplifying process, improving process integration, and reducing process costs.

The present disclosure also provides an electronic device, including a photosensitive sensor provided by various embodiments of the present disclosure.

In various embodiment, the electronic device may be a cell phone, a tablet, a laptop, a navigator, a camera, a camcorder, a sweeping robot, a virtual reality device, an augmented reality device, or another electronic product or device with photoelectric sensing functions, or any intermediate product including a photosensitive sensor provided by various embodiments of the present disclosure.

The photoelectric sensor provided by various embodiments of the present disclosure may have improved performance. By adopting the photosensitive sensor provided by various embodiments of the present disclosure, the performance of the electronic device may be improved, and the user experience may be also improved.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A photoelectric sensor having a photosensitive area and a lead area surrounding the photosensitive area and including a first lead area and a second lead area surrounding the first lead area, comprising:

a pixel substrate, including a first surface and a second surface opposite to each other, wherein a plurality of photosensitive units is formed in the pixel substrate in the photosensitive area;

isolation structures in the pixel substrate between the plurality of photosensitive units and exposing the second surface of the pixel substrate, wherein the isolation structures include conductive layers;

a plurality of interconnection structures distributed in the pixel substrate, wherein: an end of each interconnection structure is exposed on the second surface, the plurality of interconnection structures includes first interconnection structures in the first lead area and second interconnection structures in the second lead area, and the second interconnection structures are electrically connected to the first interconnection structures;

a metal grid located on the conductive layers on the second surface and in contact with the conductive layers;

a connection layer on the second surface in the first lead area and in contact with the metal grid and the first interconnection structures, to electrically connect the metal grid and the first interconnection structures;

pad layers on the second surface in the lead area, wherein: a thickness of the pad layers is larger than thicknesses of the connection layer and the metal grid, and the pad layers include a first pad layer in the second lead area and in contact with ends of the second interconnection structures facing the second surface; and a passivation layer on the second surface of the pixel substrate, wherein:

the passivation layer covers the connection layer and the metal grid, and is also located between the pad layers; and a top surface of the passivation layer located in the second lead area is higher than a top surface of the passivation layer located in the first lead area and photosensitive area.

2. The photoelectric sensor according to claim 1, wherein:

the second surface of the pixel substrate is a light-receiving surface;

the photoelectric sensor further includes: a logic substrate including a bonding surface;

the bonding surface of the logic substrate is bonded to the first surface of the pixel substrate;

a logic device is formed in the logic substrate;

the plurality of interconnection structures further includes third interconnection structures located in the pixel substrate in the second lead area and having a gap from the second interconnection structures;

the third interconnection structures are electrically connected to the logic device;

a number of the pad layers is multiple; and the pad layers further include a second pad layer located in the second lead area and in contact with ends of the third interconnect structures facing the second surface.

3. The photoelectric sensor according to claim 1, wherein:

each isolation structure includes one corresponding conductive layer and an insulating layer between the conductive layer and the pixel substrate.

4. The photoelectric sensor according to claim 3, wherein:

the conductive layer is made of a material including one or more of tungsten, titanium, titanium nitride, tantalum nitride, or copper; and the insulating layer is made of a material including one or more of silicon oxide, silicon oxynitride, silicon nitride, aluminum oxide, or tantalum oxide.

5. The photoelectric sensor according to claim 1, wherein:

the pixel substrate further includes a metal interconnection line located on a side of the pixel substrate close to the first surface;

the metal interconnection line is in contact with ends of the first interconnection structures facing the first surface and ends of the second interconnection structures facing the first surface; and the metal interconnection line electrically connects the first interconnection structures and the second interconnection structures.

6. The photoelectric sensor according to claim 5, wherein:

along a direction from the first surface to the second surface, the pixel substrate includes a rear-end pixel interconnection layer and a front-end pixel device layer stacked sequentially;

the plurality of interconnection structures penetrates the front-end pixel device layer and is also located in part of a thickness of the rear-end pixel interconnection layer; and the metal interconnection line is located in the rear-end pixel interconnection layer.

7. The photoelectric sensor according to claim 1, wherein:

along a direction parallel to the first surface, a distance between the first interconnection structures and the isolation structures is 10 μm to 50 μm; and along the direction parallel to the first surface, a distance between the first interconnection structures and the second interconnection structure is 10 μm to 50 μm.

8. The photoelectric sensor according to claim 2, wherein:

along a direction parallel to the first surface, a distance between the second interconnection structures and third interconnection structures is 30 μm to 100 μm.

9. The photoelectric sensor according to claim 1, wherein:

the plurality of interconnection structures is through silicon via interconnection structures.

10. The photoelectric sensor according to claim 1, wherein:

a number of the second interconnection structures corresponding to the first pad layer is one or more.

11. The photoelectric sensor according to claim 1, wherein:

a thickness of the connection layer is same as a thickness of the metal grid.

12. The photoelectric sensor according to claim 1, wherein:

the connection layer and the metal grid have an integrated structure.

13. The photoelectric sensor according to claim 1, wherein:

the plurality of interconnection structures is made of a material including one or more of copper, tungsten, cobalt, nickel, titanium, tantalum, titanium nitride or tantalum nitride;

the metal grid is made of a material including one or more of aluminum or tungsten;

the connection layer is made of a material including one or more of aluminum or tungsten; and the pad layers are made of a material including one or more of aluminum, titanium, gold, or tin-doped indium oxide.

14. The photoelectric sensor according to claim 1, wherein the passivation layer includes:

a first dielectric layer located on the second surface; and a second dielectric layer located on the first dielectric layer.

15. A fabrication method of a photoelectric sensor, comprising:

providing a pixel substrate including a first surface and a second surface opposite to each other, wherein: the pixel substrate has a photosensitive area and a lead area surrounding the photosensitive area, the lead area includes a first lead area and a second lead area surrounding the first lead area, and a plurality of photosensitive units is formed in the pixel substrate in the photosensitive area;

forming isolation structures in the pixel substrate between the plurality of photosensitive units, wherein an end of each isolation structure is exposed on the second surface, and each isolation structure includes a conductive layer;

forming a plurality of interconnection structures distributed in the pixel substrate, wherein: an end of each interconnection structure is exposed on the second surface, the plurality of interconnection structures includes first interconnection structures in the first lead area and second interconnection structures in the second lead area, and the second interconnection structures are electrically connected to the first interconnection structures;

forming pad layers on the second surface in the lead area, wherein: the pad layers include a first pad layer in the second lead area and in contact with ends of the second interconnection structures facing the second surface;

forming a metal grid located on conductive layers on the second surface, and forming a connection layer on the second surface and in contact with the metal grid and the first interconnection structures, wherein the metal grid is in contact with the conductive layers and the connection layer electrically connects the metal grid and the first interconnection structures;

forming a passivation layer covering the metal grid, the connection layer, and the pad layers; and removing a portion of the passivation layer on the pad layers to expose the pad layers.

16. The fabrication method of the photoelectric sensor according to claim 15, wherein:

the second surface of the pixel substrate is a light-receiving surface;

the fabrication method of the photoelectric sensor further includes:

after providing the pixel substrate and before forming the isolation structures, forming a logic substrate including a bonding surface, wherein a logic device is formed in the logic substrate; and bonding the bonding surface of the logic substrate to the first surface of the pixel substrate;

the plurality of interconnection structures further includes third interconnection structures located in the pixel substrate in the second lead area and having a gap from the second interconnection structures;

the third interconnection structures are electrically connected to the logic device; and a number of the pad layers is multiple; and the pad layers further include a second pad layer located in the second lead area and in contact with ends of the third interconnect structures toward the second surface.

17. The fabrication method of the photoelectric sensor according to claim 15, wherein:

when forming the pad layers, a first dielectric layer is also formed on the second surface of the pixel substrate to cover the isolation structures and the first interconnection structures;

the fabrication method of the photosensor further includes: after forming the pad layers, forming a second dielectric layer d on the first dielectric layer to cover the pad layers, wherein the second dielectric layer and the first dielectric layer constitute a bottom dielectric layer; and forming the metal grid and the connection layer includes: removing part of a thickness of the bottom dielectric layer in the photosensitive area and the first lead area to expose the first interconnection structures and the isolation structures; and forming the metal grid on the isolation structures and in contact with the conductive layers, and forming the connection layer on the first interconnect structures and connected to the metal grid.

18. The fabrication method of the photoelectric sensor according to claim 15, wherein:

when providing the pixel substrate, a metal interconnection line is further formed in a side of the pixel substrate close to the first surface;

when forming the plurality of interconnection structures, the first interconnection structures and the second interconnection structures are in contact with the metal interconnection line; and the first interconnection structures and the second interconnection structures are electrically connected through the metal interconnection line.

19. The fabrication method of the photoelectric sensor according to claim 15, wherein:

a top surface of the passivation layer located in the second lead area is higher than a top surface of the passivation layer located in the first lead area and photosensitive area.

20. An electronic device, comprising a photosensitive sensor having a photosensitive area and a lead area surrounding the photosensitive area and including a first lead area and a second lead area surrounding the first lead area, wherein:

the photoelectric sensor includes:

a pixel substrate, including a first surface and a second surface opposite to each other, wherein a plurality of photosensitive units is formed in the pixel substrate in the photosensitive area;

isolation structures in the pixel substrate between the plurality of photosensitive units and exposing the second surface of the pixel substrate, wherein the isolation structures include conductive layers;

a plurality of interconnection structures distributed in the pixel substrate, wherein: an end of each interconnection structure is exposed on the second surface, the plurality of interconnection structures includes first interconnection structures in the first lead area and second interconnection structures in the second lead area, and the second interconnection structures are electrically connected to the first interconnection structures;

a metal grid located on conductive layers on the second surface and in contact with the conductive layers;

a connection layer on the second surface in the first lead area and in contact with the metal grid and the first interconnection structures, to electrically connect the metal grid and the first interconnection structures;

pad layers on the second surface in the lead area, wherein: a thickness of the pad layers is larger than thicknesses of the connection layer and the metal grid, and the pad layers include a first pad layer in the second lead area and in contact with ends of the second interconnection structures facing the second surface; and a passivation layer on the second surface of the pixel substrate, wherein:

the passivation layer covers the connection layer and the metal grid, and is also located between the pad layers; and a top surface of the passivation layer located in the second lead area is higher than a top surface of the passivation layer located in the first lead area and photosensitive area.

* * * * *